United States Patent
Geairon et al.

(10) Patent No.: US 8,381,010 B2
(45) Date of Patent: Feb. 19, 2013

(54) GLITCH-FREE CLOCK SWITCHING CIRCUIT

(75) Inventors: Sebastien Geairon, La Chapelle Heulin (FR); Pascal Commun, Cholet (FR); Pierre Saint Ellier, Saumur (FR)

(73) Assignee: Thales, Neuilly sur Feine (FR)

( * ) Notice: Subject to any disclaimer, the term of this patent is extended or adjusted under 35 U.S.C. 154(b) by 308 days.

(21) Appl. No.: 12/945,744

(22) Filed: Nov. 12, 2010

(65) Prior Publication Data
US 2011/0283133 A1    Nov. 17, 2011

(30) Foreign Application Priority Data
Nov. 13, 2009  (FR) ..................... 09 05472

(51) Int. Cl.
*G06F 1/08* (2006.01)
(52) U.S. Cl. ............ 713/501; 713/400; 327/40; 327/145
(58) Field of Classification Search .................. 713/400, 713/501; 327/40, 145
See application file for complete search history.

(56) References Cited

U.S. PATENT DOCUMENTS

| 4,613,777 | A  |   | 9/1986 | Kible |
|-----------|----|---|--------|-------|
| 5,099,141 | A  | * | 3/1992 | Utsunomiya .................... 327/99 |
| 5,506,982 | A  | * | 4/1996 | Hotta et al. .................... 713/501 |
| 5,524,035 | A  |   | 6/1996 | Casal et al. |
| 5,602,812 | A  | * | 2/1997 | Miura et al. ................. 369/47.3 |
| 6,633,991 | B1 |   | 10/2003| Goldrian |
| 2004/0153681 | A1 | * | 8/2004 | Cao ............................. 713/400 |

FOREIGN PATENT DOCUMENTS

| DE | 3346942 C1 | 1/1985 |
| DE | 10018190 A1 | 2/2001 |

* cited by examiner

*Primary Examiner* — Thuan Du
(74) *Attorney, Agent, or Firm* — Baker Hostetler LLP

(57) ABSTRACT

A circuit for switching clocks includes a first input intended to receive a first clock signal at a frequency alternately equal to a first value or a second value, a second input intended to receive a second clock signal, synchronous with the first clock signal, at a third frequency and an output intended to deliver a third clock signal at a frequency alternately equal to the first value or the third value.

4 Claims, 4 Drawing Sheets

GLITCH-FREE CLOCK SWITCHING CIRCUIT

CROSS-REFERENCE TO RELATED APPLICATION

This application claims priority to foreign French patent application No. FR 0905472, filed on Nov. 13, 2009, the disclosure of which is incorporated by reference in its entirety.

FIELD OF THE INVENTION

The present invention relates to a circuit for switching between two different frequency clocks from among three frequencies available at input. One of the three input frequencies is eliminated by the switching circuit which, at its output, produces toggling between the other two frequencies.

BACKGROUND OF THE INVENTION

The requirement for clock switching is present in the design of electronic circuits which necessitate at least two processing frequencies of distinct values, for example a high frequency and a low frequency. More often than not the existing switching circuits make it possible to toggle between two clock signals of distinct frequencies, but of fixed values F1 and F2 which cannot be modified. Within the framework of an enhancement of a product using such a switching circuit, a new requirement relating to a clock signal of frequency F3 which differs from the two available frequencies F1 and F2 may arise. Under the constraint of a reuse of the said switching circuit, the problem to be solved relates to the implementation of a solution outside this circuit which makes it possible, on the basis of the clock signal of frequency F1 or F2 and of a third clock signal of frequency F3 to perform a switching between the frequency F1 and the frequency F3. This switching solution must be compact and exhibit minimum consumption and the toggling of clocks must be done without generating glitches so as not to disturb the operation of the processor which is thereafter driven by the frequencies F1 or F3.

The existing solutions do not make it possible, on the basis of a first circuit for switching between two clocks of frequencies F1 and F2, to replace the frequency F2 with another frequency F3 and to perform glitch-free toggling.

SUMMARY OF THE INVENTION

The solution proposed by the invention consists of a circuit for switching clocks using a detector of the frequency F2 whose output is resynchronized by way of a D flip-flop and of a NOR logic gate.

For this purpose, the subject of the invention is a circuit for switching clocks comprising a first input intended to receive a first clock signal at a frequency alternately equal to a first value F1 or a second value F2, a second input intended to receive a second clock signal, synchronous with the said first clock signal, at a third frequency F3 and an output intended to deliver a third clock signal without glitches at a frequency alternately equal to the said first value F1 or the said third value F3, wherein the said switching circuit additionally comprises:
a switch receiving the said first and second clock signals and delivering one or the other of these said signals so as to produce the said third clock signal,
a "NOR" logic gate delivering a synchronization signal resulting from the "NOR" logic function between the said first clock signal and the said second clock signal,
a frequency detector receiving the said first clock signal so as to filter one of the two frequencies F1 or F2 of the said signal and to produce a signal exhibiting a first level A when the frequency of the said first clock signal is equal to F1 and a second level B when the said frequency is equal to F2,
a D flip-flop logic circuit receiving the synchronization signal and the signal originating from the frequency detector and producing a control signal destined for the said switch driving the switching between the said first and second clock signals in such a way that the said third clock signal is equal:
to the said first clock signal when the frequency of the said first clock signal is equal to F1
to the said second clock signal when the frequency of the said first clock signal is equal to F2.

In a variant embodiment of the invention, the said frequency detector comprises at least the following components: a first resistor whose input is linked to the input of the said frequency detector, a first capacitor connected on one side to the said first resistor and on the other side to a second resistor linked to ground, a diode whose anode is linked to the said first capacitor and whose cathode is connected to a second capacitor linked to ground, as well as to a third resistor linked to ground and to a fourth resistor, a transistor whose base is connected to the said fourth resistor, whose emitter is linked to ground and whose collector is linked to a fifth resistor supplied by a DC voltage and a pair of NOT logic gates linked in cascade, the input of the first NOT logic gate being linked to the collector of the transistor and the output of the second NOT logic gate being linked to the output of the said frequency detector, the values of the said components being determined so as to carry out a filtering of one of the two frequencies F1 or F2 of the said first clock signal.

In another variant embodiment of the invention, the value F3 of the frequency of the said second clock signal is equal to twice the second value F2 of the frequency of the said first clock signal.

BRIEF DESCRIPTION OF THE DRAWINGS

Other characteristics will become apparent on reading the following detailed description given by way of nonlimiting example, offered in relation to appended drawings in which.

DETAILED DESCRIPTION

Figure 1:
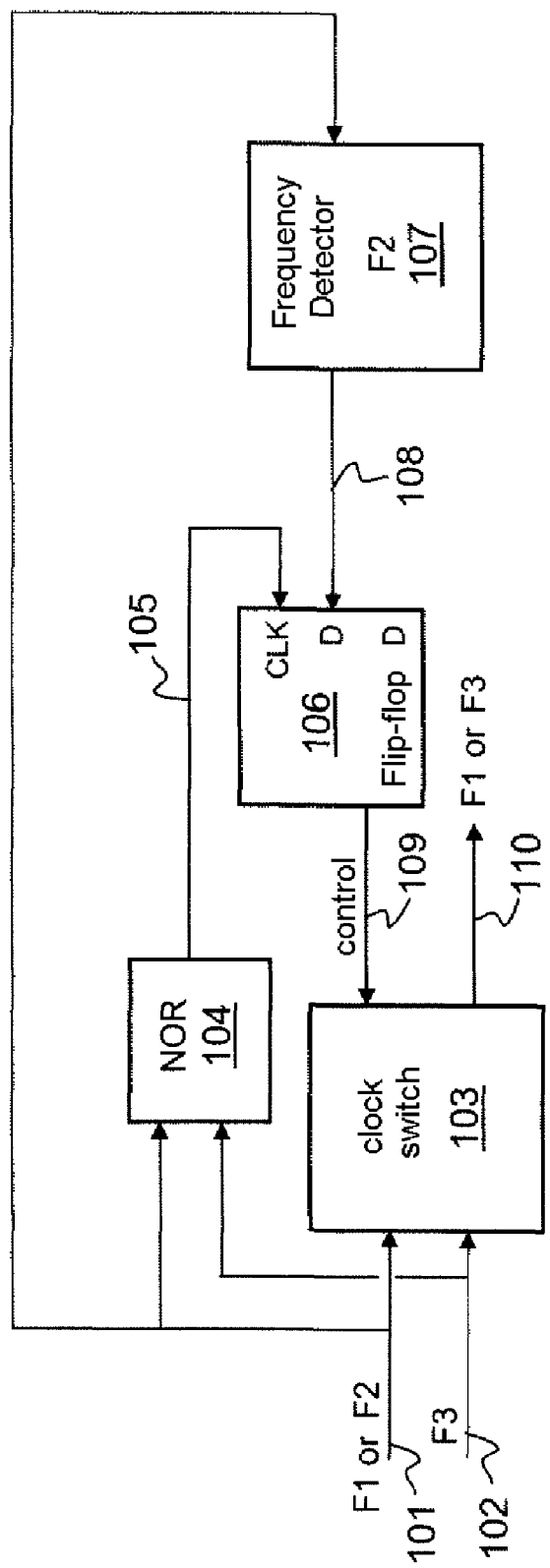
FIG. 1 shows a schematic of the switching circuit according to the invention.

FIG. 1 shows schematically the switching circuit according to the invention. A first clock signal 101 is injected on a first input of a clock switch 103. This first signal 101 exhibits two distinct clock frequency values F1 and F2, for example a low frequency and a high frequency. At a given instant, the clock signal 101 is generated at the frequency F1, and then at a subsequent instant, it switches to the frequency F2 or vice versa. This signal 101 originates for example from a clock-generating circuit suitable for delivering two signals at two distinct clock frequencies and to switch from one to the other at a given instant. A second clock signal 102 generated at a third frequency F3 is injected on the second input of the clock switch 103. The frequency F3 is for example a multiple of the frequency F2 but can also adopt any value. The clock signals 101 and 102 are synchronous. The function of the clock switch 103 is to deliver at its output 110 a signal of frequency F1 or F3 and to switch from one to the other as a function of the command given by the control signal 109. The switching of clocks is done, moreover, without glitches which could disturb, for example, a microprocessor driven by the clock signal 110.

The clock signals 101,102 are provided as input to a NOR logic gate 104 which produces at its output a synchronization signal 105 which comprises a high level when the two input signals of the NOR gate 104 go to a zero value.

The first clock signal 101 is also provided as input to a frequency detector 107, the function of which is to filter the frequency F1 and to provide at output a signal 108 for detecting the frequency F2. This signal 108 exhibits a high level when the clock signal 101 uses the frequency F1 and a low level when this signal 101 uses the frequency F2. The frequency detector 107 implements notably a filtering function around the frequency F1 followed by a single-wave rectification and by a second filtering so that only the clock signal of frequency F1 gives rise to a high level on the output 108 of the detector. This output 108 is thereafter linked to the input of the D flip-flop 106 which carries out a copyover of the output signal of the frequency detector 107 to the control signal 109 but while synchronizing it with the aid of the synchronization signal 105.

The clock switch 103 therefore delivers at its output 110, a signal of frequency F1 if the first input signal 101 is of frequency F1, and a signal of frequency F3 if the first input signal 101 is of frequency F2. This is done using the detection of the frequency F2.

In a variant embodiment of the invention, the frequency detector 107 can alternately filter the frequency F2 so as to produce at output 108 a signal exhibiting a first level A when the frequency F1 is detected and a second level B when the frequency F2 is detected.

Figure 2:
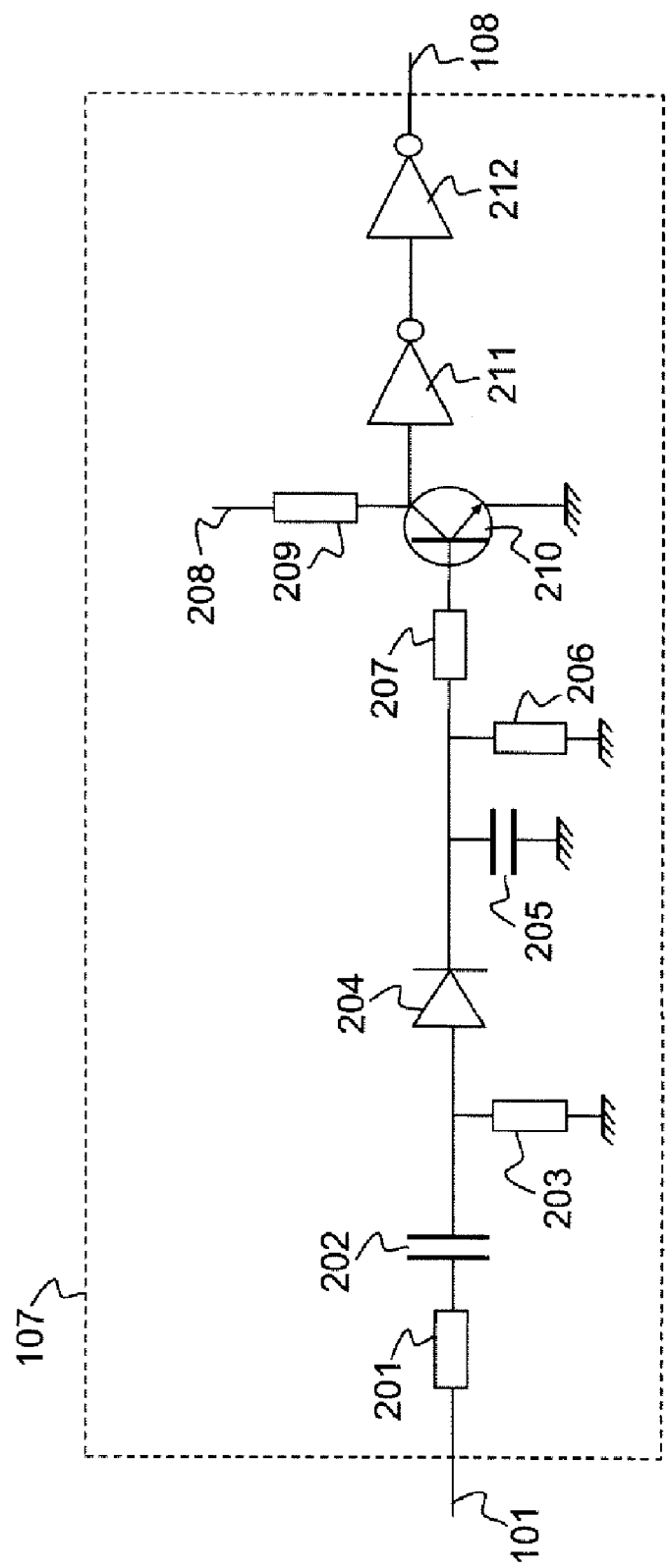
FIG. 2 shows an exemplary embodiment of the frequency detection function implemented in the switching circuit according to the invention.

FIG. 2 illustrates an exemplary embodiment of the frequency detector 107. The function of this detector is to filter the frequency F1 so as to produce at output a signal which exhibits a high level when the input signal 101 operates at the frequency F1 and a low level when the frequency F2 is used. The aim of the detector 107 is to detect the presence of the frequency F2 so as to indicate to the clock switch 103 to switch to the frequency F3 in place of the frequency F2.

The frequency detector 107 comprises a first resistor 201 receiving as input the clock signal 101 and linked at output to a capacitor 202 itself linked to a second resistor 203 and to a diode 204. At its other end the second resistor 203 is linked to ground. The diode 204 is linked to a capacitor 205 itself connected to ground, to a third resistor 206 also linked to ground and to a fourth resistor 207 linked to the base of a transistor 210 whose emitter is linked to ground and whose collector is connected to a DC voltage supply 208 across a fifth resistor 209. The collector of the transistor 210 is also linked to two NOT gates 211,212 strung together in cascade. The signal 108 for detecting the frequency F2 is delivered as output from the second NOT gate 212.

Figure 3:
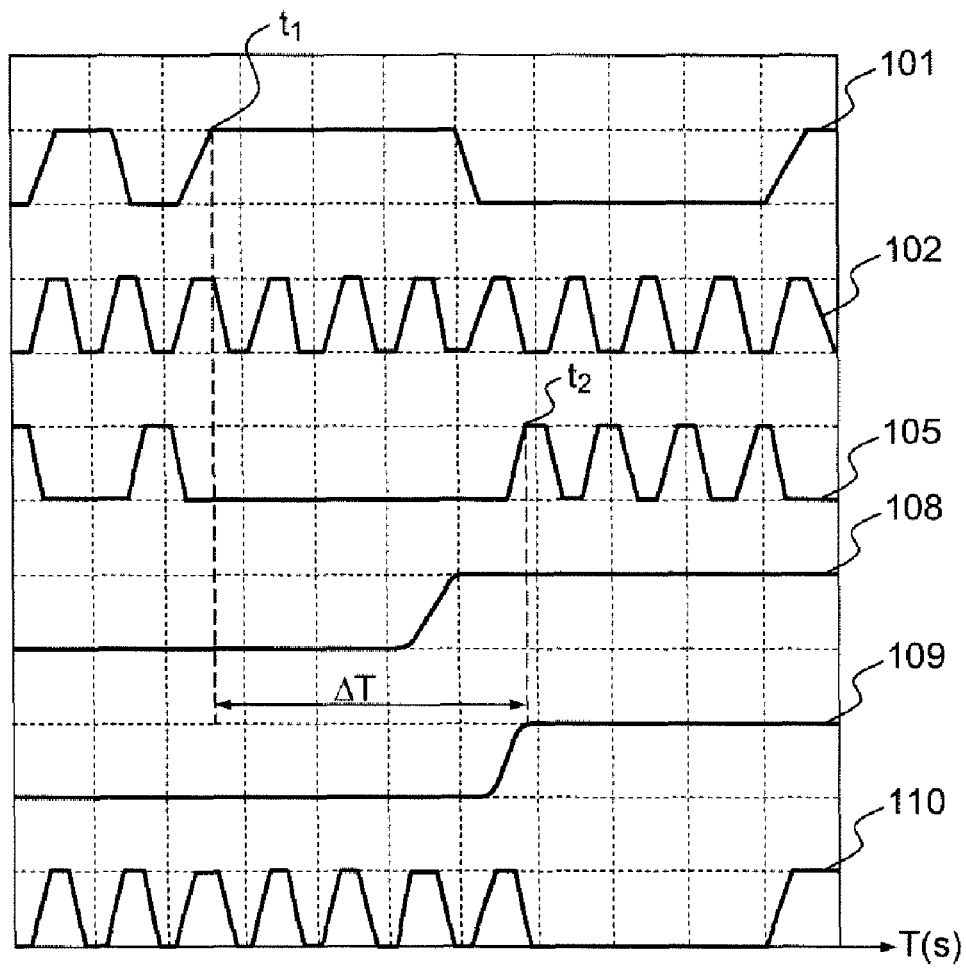
FIGS. 3 and 4 show two diagrams representing the timing diagrams of the signals measured at various points of the circuit according to the invention.

FIG. 3 represents an example of timing diagrams of the various signals necessary for the operation of the switching circuit according to the invention such as described in support of FIG. 1. To illustrate the operation of the said circuit, the example of FIG. 3 uses a frequency F1 of low value, for example F1=51 KHz, a high frequency F2, for example F2=9600 kHz and a frequency F3 equal to twice the frequency F2, i.e. F3=19200 kHz. The example illustrated corresponds to a switching from F3 to F1.

The first clock signal 101 propagates at the frequency F2, and then at an instant t1 switches to the lower frequency F1. The second clock signal 102 propagates constantly at the frequency F3. The synchronization signal 105 corresponds to the "NOR" logic function applied to the two previous clock signals, it therefore exhibits a high level when the two clock signals 101,102 simultaneously exhibit a low level and a low level in the other cases. The signal 108 output by the frequency detector 107 exhibits a low level when the first clock signal 101 uses the frequency F2 and then a high level when the latter toggles to the frequency F1. The control signal 109 corresponds to a time shift by an offset ΔT of the signal 108. The offset ΔT is due on the one hand to the latency induced by the frequency detector 107 and on the other hand to the fact that the control signal 109 is resynchronized by the high level of the synchronization signal 105 which occurs at the instant t2. The switched signal 110 therefore exhibits a frequency F3 when the first clock signal 101 exhibits a frequency F2 and then the said switched signal 110 toggles to the frequency F1 when the control signal 109 toggles to a high level indicating to it in this way that the first clock signal 101 has itself toggled to the frequency F1.

Figure 4:
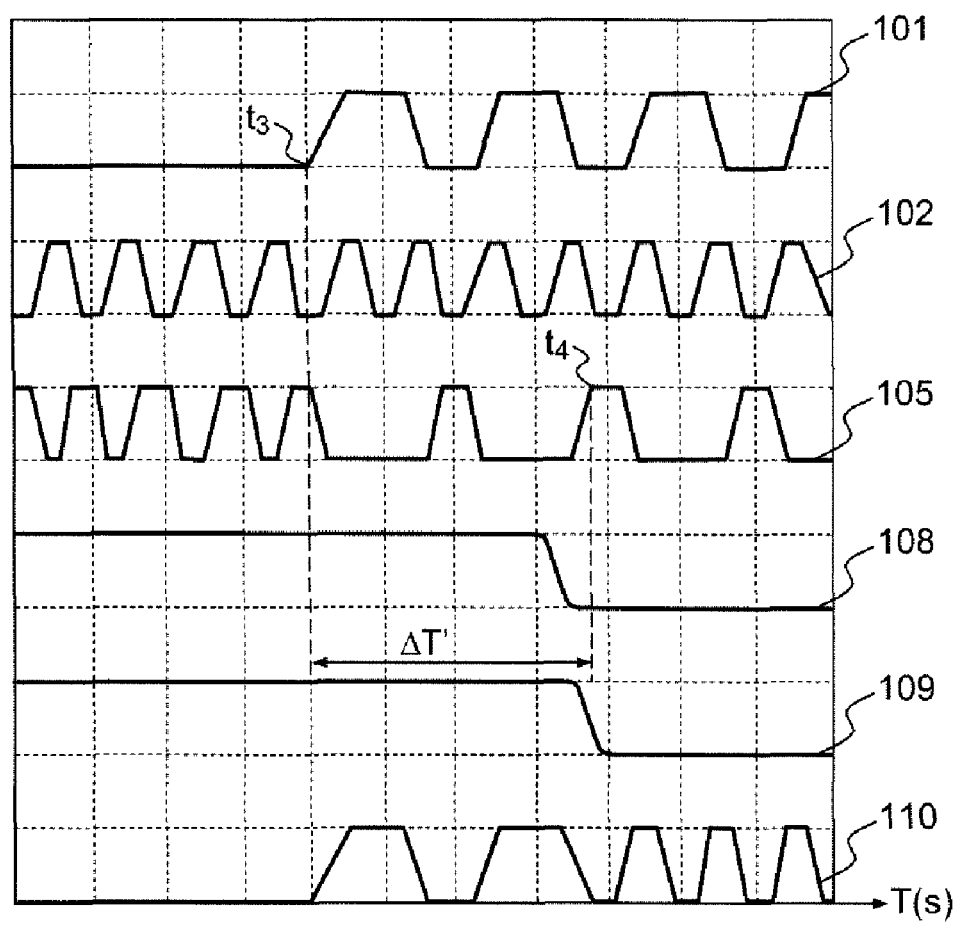

FIG. 4 illustrates another example of timing diagrams in the case of switching from the frequency F1 to the frequency F3.

The first clock signal 101 toggles at an instant t3 from the frequency F1 to the frequency F2. The second clock signal 102 still exhibits a constant frequency F3 equal to twice the frequency F2. The synchronization signal 105 is created on the basis of the "NOR" logic function applied to the two clock signals 101,102. The signal 108 output by the frequency detector toggles from a high level to a low level at the instant t3. The control signal 109 toggles from a high level to a low level at the instant t4 where the synchronization signal 105 reverts to a high level for the first time after the latency induced by the frequency detector 107 has elapsed.

The switched signal 110 follows the value of the first clock signal 101 until the instant t4 and then toggles to the value of the second clock signal 102. It is noted here that the switch from the frequency F1 to the frequency F3 passes through the intermediate value F2 for a short time span ΔT'=t4−t3 which corresponds to the time which elapses between the toggling from the frequency F1 to the frequency F2 and the instant at which the control signal 109 passes to a low level. During this time, the clock switch 103 still delivers as output the first clock signal 101 whose frequency has already toggled to its value F2. This behaviour is not penalizing since the latency induced by the frequency detector 107 is small.

In a variant embodiment, the signals 108 and 109 output by the frequency detector 107 can exhibit levels inverse to those mentioned in support of FIGS. 3 and 4. In a more general case, these two signals go from a first level A to a second level B when there is toggling from the frequency F1 to F2 (or vice versa) at the input of the device.

The switching circuit according to the invention notably presents the advantage of being compact and frugal in its consumption, this being essential for embedded applications within portable equipment such as for example a mobile telephone.

The invention claimed is:

1. A circuit for switching clocks comprising:
   a first input intended to receive a first clock signal at a frequency alternately equal to a first value F1 or a second value F2, a second input intended to receive a second clock signal, synchronous with the said first clock signal, at a third frequency F3 and an output intended to deliver a third clock signal without glitches at a frequency alternately equal to the said first value F1 or to the third value F3, a switch receiving the first and second clock signals and delivering one or the other of said signals so as to produce the third clock signal, a "NOR" logic gate delivering a synchronization signal resulting from the "NOR" logic function between the first clock signal and the second clock signal, a frequency detector receiving the first clock signal so as to filter one of the two frequencies F1 or F2 of said signal and to produce a signal exhibiting a first level A when the frequency of the first clock signal is equal to F1 and a second level B when the frequency is equal to F2, and a D flip-flop logic circuit receiving the synchronization signal and the signal originating from the frequency detector and producing a control signal destined for the switch driving the switching between the first and second clock signals in such a way that the third clock signal is equal to the first clock signal when the frequency of the first clock signal is equal to F1, and is equal to the said second clock signal when the frequency of the first clock signal is equal to F2.

2. The circuit for switching clocks according to claim 1, wherein the frequency detector further comprises:

a first resistor whose input is linked to the input of the frequency detector, a first capacitor connected on one side to the first resistor and on the other side to a second resistor linked to ground, a diode whose anode is linked to the first capacitor and whose cathode is connected to a second capacitor linked to ground, as well as to a third resistor linked to ground and to a fourth resistor, a transistor whose base is connected to the fourth resistor, whose emitter is linked to ground and whose collector is linked to a fifth resistor supplied by a DC voltage and a pair of NOT logic gates linked in cascade, the input of the first NOT logic gate being linked to the collector of the transistor and the output of the second NOT logic gate being linked to the output of the frequency detector, the values of said components being determined so as to carry out a filtering of one of the two frequencies F1 or F2 of the first clock signal.

3. The circuit for switching clocks according to claim 2, wherein the value F3 of the frequency of the second clock signal is equal to twice the second value F2 of the frequency of the first clock signal.

4. The circuit for switching clocks according to claim 1, wherein the value F3 of the frequency of the second clock signal is equal to twice the second value F2 of the frequency of the first clock signal.

* * * * *